United States Patent
Ueyama

(10) Patent No.: US 9,431,806 B2
(45) Date of Patent: Aug. 30, 2016

(54) WATERPROOF BOX AND ELECTRIC JUNCTION BOX EQUIPPED WITH SAME

(71) Applicant: Yazaki Corporation, Tokyo (JP)

(72) Inventor: Kouji Ueyama, Makinohara (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 14/414,801

(22) PCT Filed: Jul. 24, 2013

(86) PCT No.: PCT/JP2013/070016
§ 371 (c)(1),
(2) Date: Jan. 14, 2015

(87) PCT Pub. No.: WO2014/017526
PCT Pub. Date: Jan. 30, 2014

(65) Prior Publication Data
US 2015/0171608 A1    Jun. 18, 2015

(30) Foreign Application Priority Data
Jul. 25, 2012   (JP) .................................. 2012-164337

(51) Int. Cl.
*H02G 3/08* (2006.01)
*B60R 16/023* (2006.01)
*H05K 5/00* (2006.01)
*H05K 5/06* (2006.01)

(52) U.S. Cl.
CPC ........... *H02G 3/088* (2013.01); *B60R 16/0238* (2013.01); *H05K 5/0004* (2013.01); *H05K 5/06* (2013.01)

(58) Field of Classification Search
USPC ...................................................... 174/50.5
See application file for complete search history.

(56) References Cited

U.S. PATENT DOCUMENTS 8,210,378 B2 *  7/2012  Takeuchi ............... H02G 3/088
                                                174/50.5
9,214,758 B2 * 12/2015  Matuschek ........ H01R 13/5202
                                                174/50.5

FOREIGN PATENT DOCUMENTS

| JP | 56-136434 U | 10/1981 |
| JP | 4-111223 U | 9/1992 |
| JP | 09-216648 A | 8/1997 |

OTHER PUBLICATIONS

International Search Report dated Sep. 3, 2013, issued for PCT/JP2013/070016.
Office Action dated May 25, 2016 issued for corresponding Chinese Patent Application No. 2013 800 39766.4.

\* cited by examiner

*Primary Examiner* — Dhirubhai R Patel
(74) *Attorney, Agent, or Firm* — Locke Lord LLP

(57) ABSTRACT

Provided is a waterproof box capable of increasing the amount of water discharged from a double wall without reducing the rigidity of a body case. A waterproof box is provided with a body case and an upper cover attached to the body case so as to cover an opening of the body case. A peripheral wall of the body case has a double-wall structure including an outer wall and an inner wall. Liquid penetrating from a seam between the upper cover and the outer wall passes between the outer wall and the inner wall and is discharged to the outside of the body case. A wide width portion and a narrow width portion which have mutually different gaps between the outer wall and the inner wall are formed in the body case.

2 Claims, 8 Drawing Sheets

WATERPROOF BOX AND ELECTRIC JUNCTION BOX EQUIPPED WITH SAME

TECHNICAL FIELD

The present invention relates to a waterproof box used in an electric junction box or the like mounted on a vehicle.

BACKGROUND ART

Various electronic devices are mounted on a vehicle. In order to perform power supply and signal transmission to the various electronic devices, an electric junction box is disposed at an appropriate position of the vehicle. The electric junction box uses a waterproof box so as to prevent water from penetrating thereinto during traveling under a rainy weather or during vehicle washing. The waterproof box has various structures, but generally includes, for example, a body case that accommodates a plurality of electrical components, and a cover that covers an opening of the body case (e.g., refer to Patent Literature 1). Also, FIG. 8 illustrates a plan view of a body case of a waterproof box used in an electric junction box according to the related art.

A body case 303 illustrated in FIG. 8 is made of a synthetic resin and includes a frame-shaped peripheral wall 339. An opening of the body case 303 is covered by a cover (not illustrated) made of a synthetic resin. Also, the peripheral wall 339 has a double-wall structure including an outer wall 331 and an inner wall 332. Water entering from a seam between the cover and the outer wall 331 passes between the outer wall 331 and the inner wall 332 and is discharged to the outside of the body case 303. That is, the waterproof box including the body case 303 and the cover as described above prevents water from splashing on the electrical components by configuring the peripheral wall 339 with the double-wall structure, without using packing.

CITATION LIST

Patent Literature

Patent Literature 1: JP 9-216648 A

SUMMARY OF INVENTION

Technical Problem

However, when an amount of water is large, the waterproof box including the body case 303 of FIG. 8 has a problem that water discharge from the double wall cannot catch up. Also, in order to increase an amount of water discharge, a gap between the outer wall 331 and the inner wall 332 of the double wall may be widened. However, in this case, the rigidity of the body case 303 is reduced.

Therefore, an object of the present invention is to provide a waterproof box capable of increasing the amount of water discharge from a double wall, without reducing the rigidity of a body case, and an electric junction box including the waterproof box.

Solution to Problem

In order to achieve the above object, one aspect of the present invention is characterized by including: a body case; and a cover attached to the body case to cover an opening of the body case, wherein a peripheral wall of the body case has a double-wall structure including an outer wall and an inner wall, such that liquid penetrating from a seam between the cover and the outer wall passes between the outer wall and the inner wall and is discharged to the outside of the body case, a wide width portion and a narrow width portion which have mutually different gaps between the outer wall and the inner wall are formed in the body case, the gap in the wide width portion being wider than the gap in the narrow width portion, and the inner wall has connection portions bent outward from the ends of the wide width portion and inward from the ends of the narrow width portion, or the outer wall has connection portions bent inward from the ends of the wide width portion and outward from the ends of the narrow width portion.

A preferred aspect of the present invention is characterized by including an electric junction box includes the waterproof box according to the one aspect of the present invention.

Advantageous Effects of Invention

According to the one aspect of the present invention, the wide width portion and the narrow width portion which have mutually different gaps between the outer wall and the inner wall are formed in the body case, such that the gap in the wide width portion is wider than the gap in the narrow width portion. Since the inner wall has connection portions bent outward from the ends of the wide width portion and inward from the ends of the narrow width portion, or the outer wall has connection portions bent inward from the ends of the wide width portion and outward from the ends of the narrow width portion, the outer wall or the inner wall of the peripheral wall has a crank-shaped cross-section, and the rigidity of the body case can be increased as compared with a case where the outer wall or the inner wall of the peripheral wall has a flat surface. Therefore, it is possible to provide the waterproof box capable of increasing the amount of water discharge from the double wall without reducing the rigidity of the body case.

According to the preferred aspect of the present invention, the electric junction box having high waterproof performance can be provided because the electric junction box is provided with the waterproof box according to the one aspect of the present invention.

DESCRIPTION OF EMBODIMENTS

A "waterproof box" and an "electric junction box" including the same according to an embodiment of the present invention will be described with reference to FIGS. 1 to 7. Also, the "electric junction box" is mounted on a vehicle to supply power to and transmit a signal to electronic devices mounted on the vehicle. Also, in the present invention, a junction block (also called "junction box"), a fuse block (also called "fuse box"), and a relay block (also called "relay box") are collectively referred to as an electric junction box.

Figure 1:
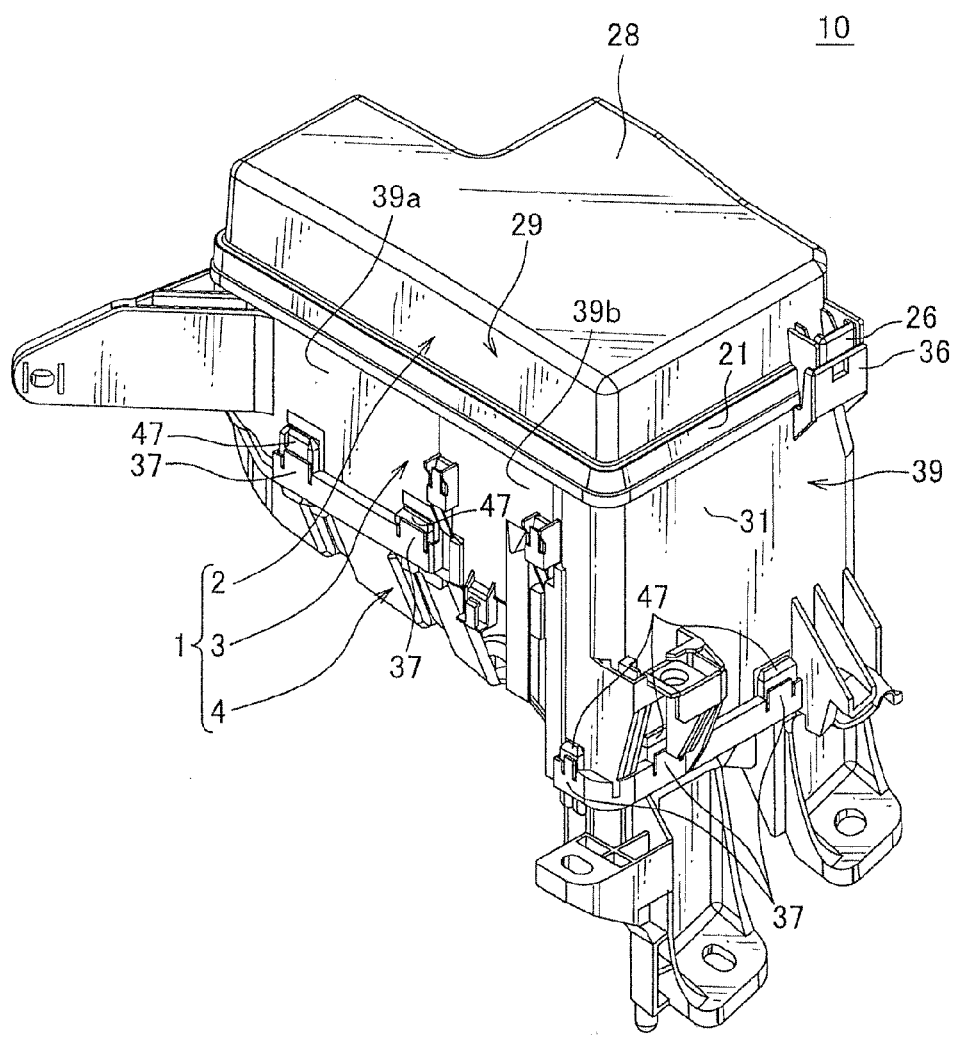
FIG. 1 illustrates a perspective view of an electric junction box including a waterproof box according to an embodiment of the present invention.
Figure 2:
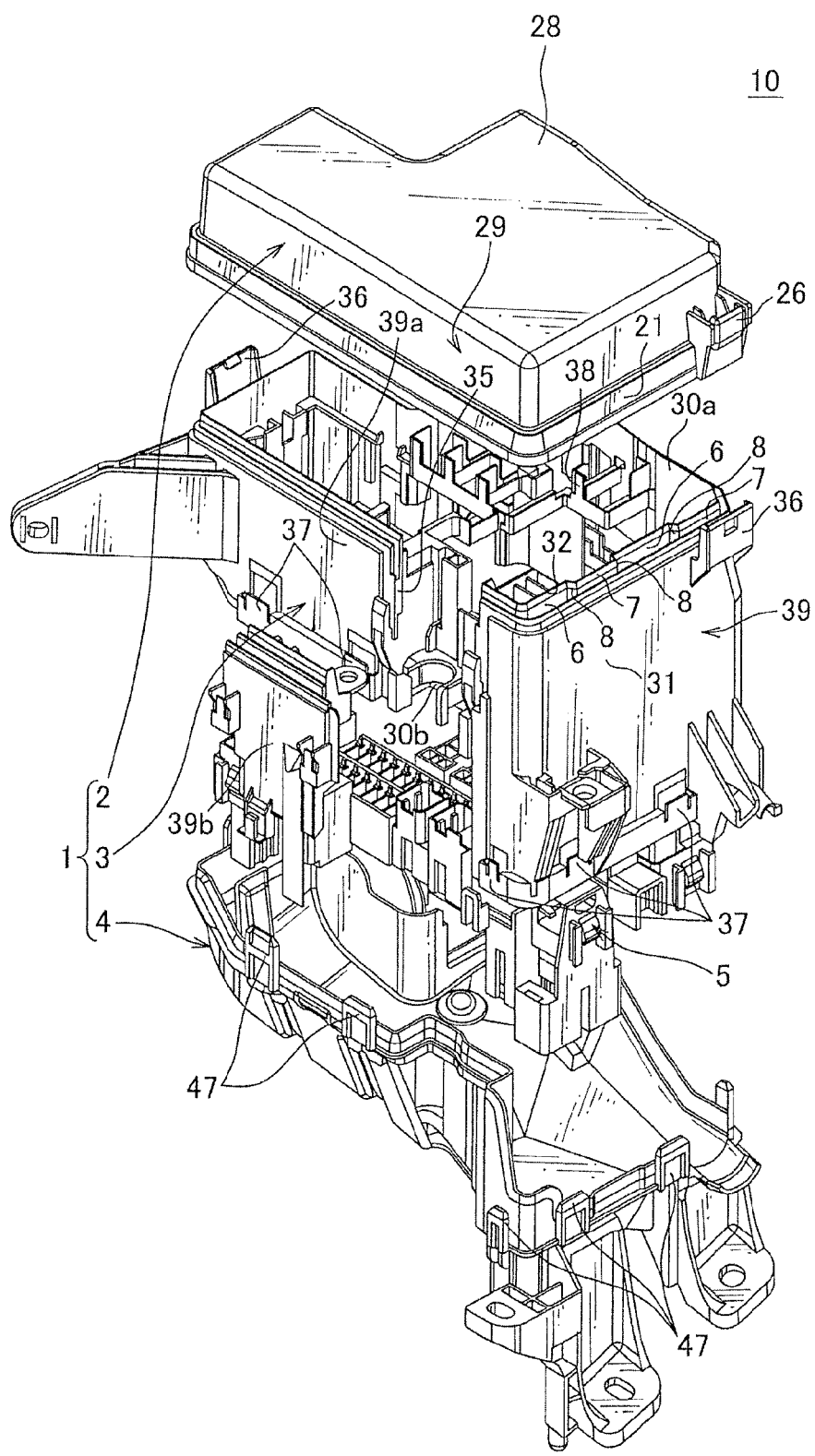
FIG. 2 illustrates an exploded view of the electric junction box of FIG. 1.

As illustrated in FIGS. 1 and 2, the electric junction box 10 includes a waterproof box 1, a cassette block 5 made of a synthetic resin and attached to the inside of the waterproof box 1, and a plurality of electrical components 11, 12, and 13 (illustrated in FIGS. 4 and 6) mounted on the cassette block 5.

The waterproof box 1 includes a body case 3, an upper cover 2 (corresponding to "cover" in claims) attached to the case 3 to cover an opening 30a of an upper surface side of the body case 3, and a lower cover 4 attached to the body case 3 to cover an opening 30b of a lower surface side of the body case 3. The body case 3, the upper cover 2, and the lower cover 4 are made of insulating synthetic resins, respectively, and are formed by a known injection molding.

The body case 3 includes a frame-shaped peripheral wall 39 in which the openings 30a and 30b are provided on the upper surface side and the lower surface side, a partition wall 38 that partitions the inside of the peripheral wall 39, and a plurality of lock receiving portions 36 and 37 provided in the peripheral wall 39. Also, the peripheral wall 39 includes a peripheral wall body 39a, and a side cover 39b mounted on a notch 35 formed in the peripheral wall body 39a. The lock receiving portion 36 is locked to a lock portion 26 provided in the upper cover 2. Also, the lock receiving portion 37 is locked to a lock portion 47 provided in the lower cover 4.

The upper cover 2 includes a ceiling wall 28, a peripheral wall 29 erected from an outer edge of the ceiling wall 28, and a plurality of lock portions 26 provided in the peripheral wall 29.

Subsequently, the waterproof structure of the waterproof box 1 will be described in detail. As illustrated in FIGS. 3 to 7, in order to improve the waterproof performance without using packing, the waterproof box 1 is configured such that the peripheral wall 39 of the body case 3 has a double-wall structure including an outer wall 31 and an inner wall 32 over the entire circumference. Similarly, the peripheral wall 29 of the upper cover 2 has a double-wall structure including an outer wall 21 and an inner wall 22 over the entire circumference. In a state in which the upper cover 2 is attached to the body case 3, the outer wall 31 of the body case 3 is positioned in the inner side rather than the outer wall 21 of the upper cover 2, the inner wall 22 of the upper cover 2 is positioned in the inner side rather than the outer wall 31 of the body case 3, and the inner wall 32 of the body case 3 is positioned in the inner side rather than the inner wall 22 of the upper cover 2. Also, the front edge of the outer wall 21 of the upper cover 2 and the upper edge of the outer wall 31 of the body case 3 are formed in a stepped shape to contact each other.

The waterproof box 1 is configured to make water penetration difficult by the stepped shape provided at the front edge of the outer wall 21 of the upper cover 2 and the upper edge of the outer wall 31 of the body case 3. However, even when water penetrates from a seam between the outer wall 21 and the outer wall 31 (portion A surrounded by a dashed line in FIGS. 4 to 7), the water passes between the outer wall 31 and the inner wall 32 and is discharged to the lower cover 4 side. Also, the water discharged to the lower cover 4 side is discharged from a drain hole (not illustrated) to the outside of the waterproof box 1.

Figure 3:
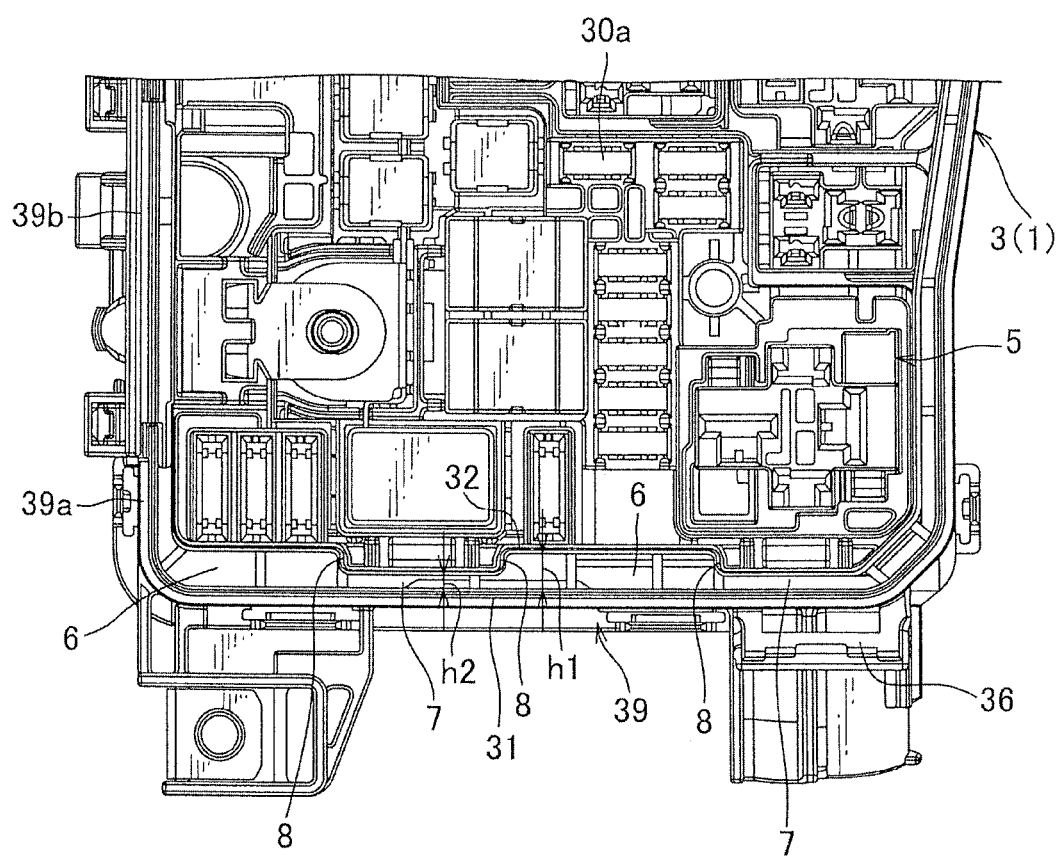
FIG. 3 illustrates a plan view of a body case of FIG. 2.
Figure 4:
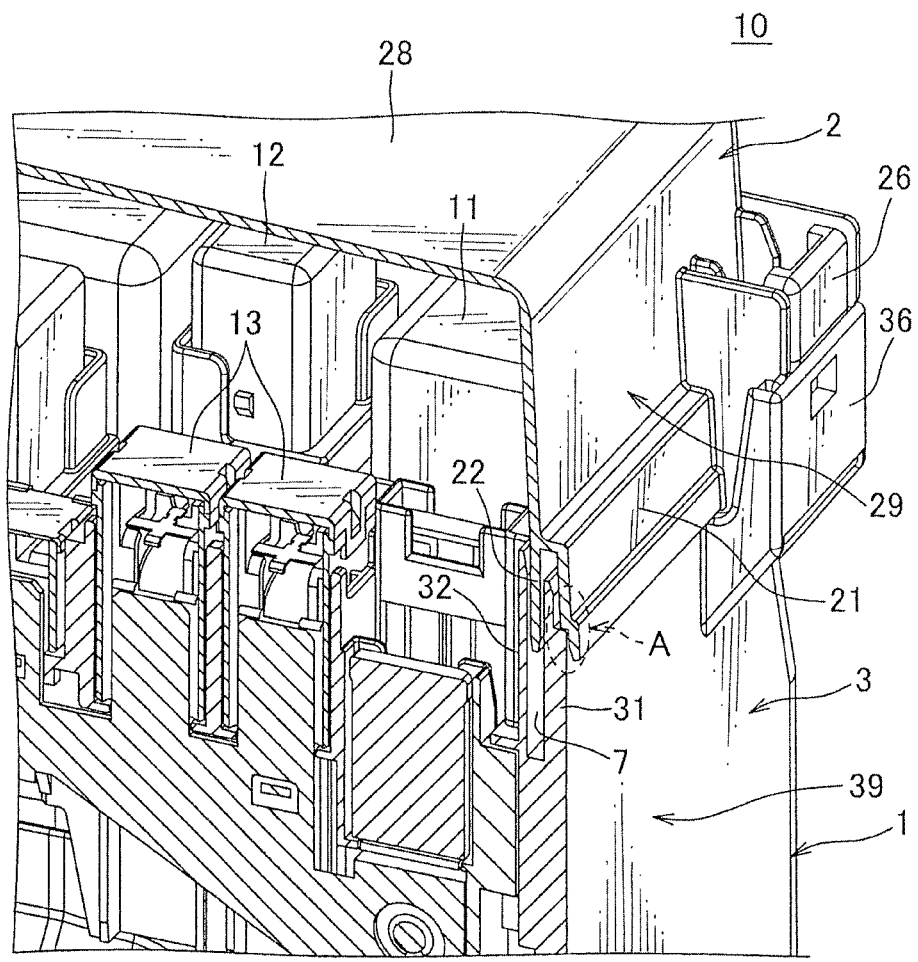
FIG. 4 illustrates a cross-section of a narrow width portion in the electric junction box of FIG. 1.
Figure 5:
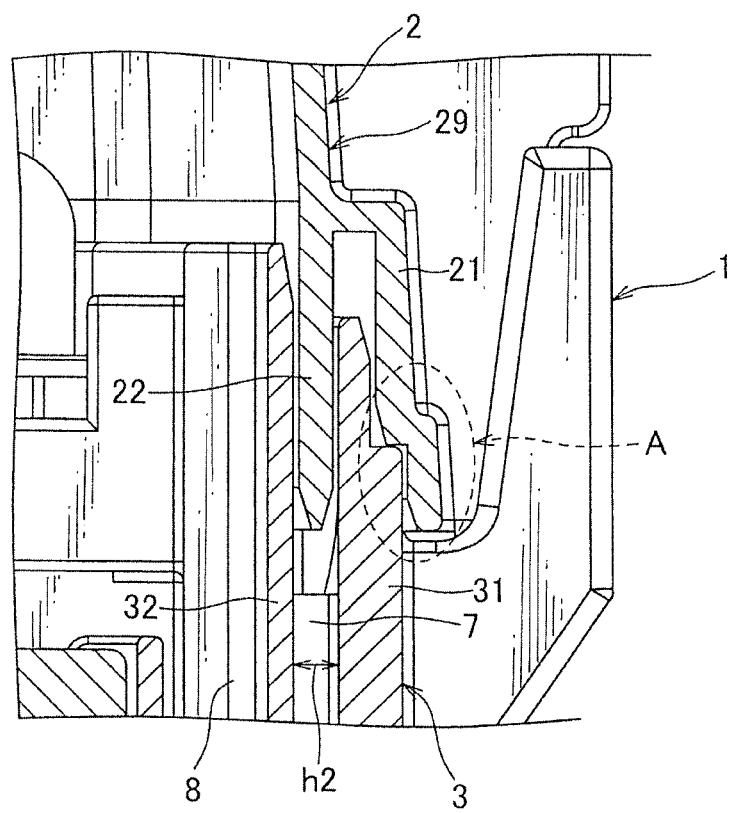
FIG. 5 illustrates an enlarged cross-sectional view of a main portion of FIG. 4.
Figure 6:
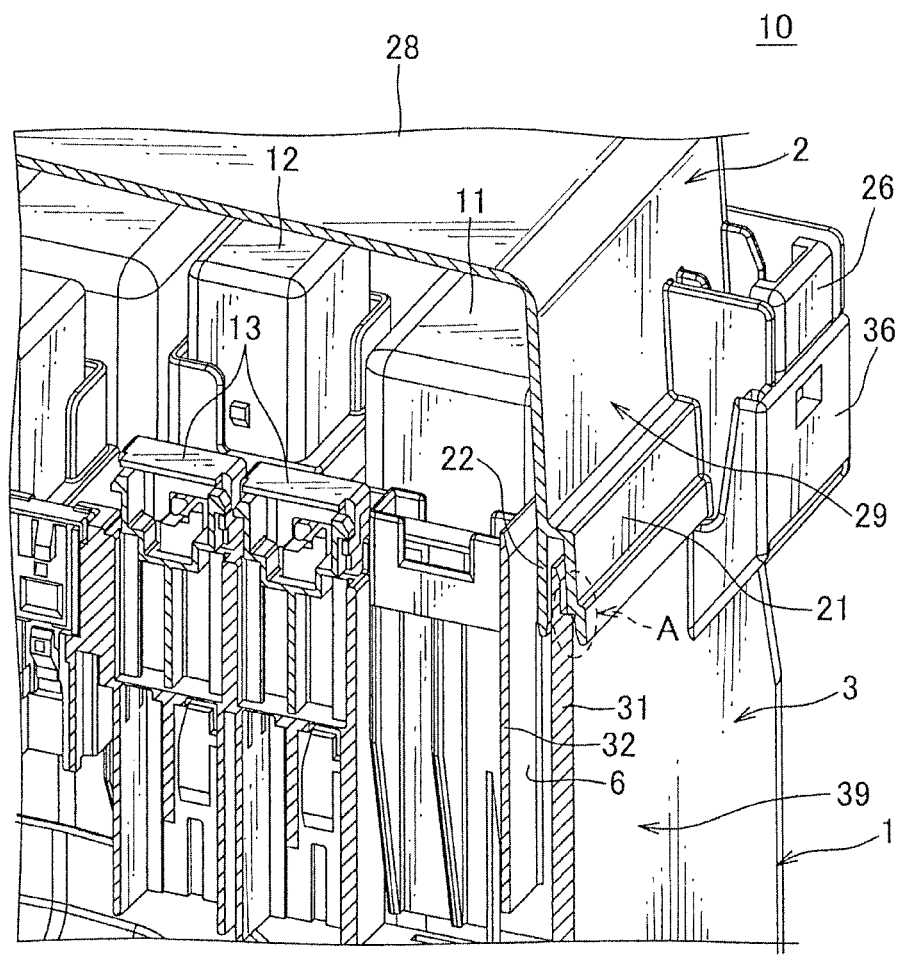
FIG. 6 illustrates a cross-section of a wide width portion in the electric junction box of FIG. 1.
Figure 7:
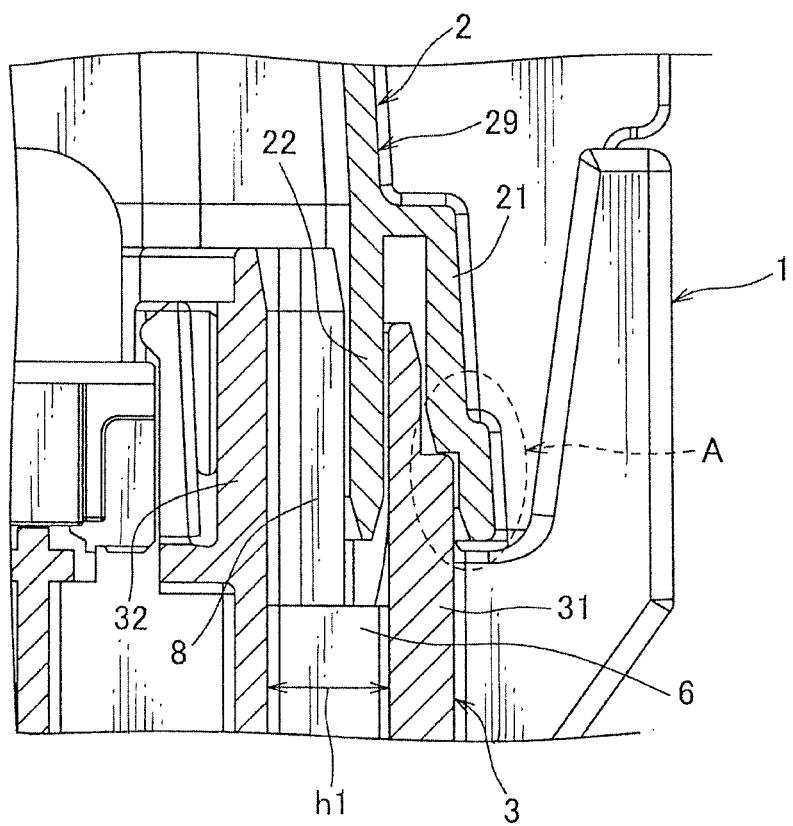
FIG. 7 illustrates an enlarged cross-sectional view of a main portion of FIG. 6.
Figure 8:
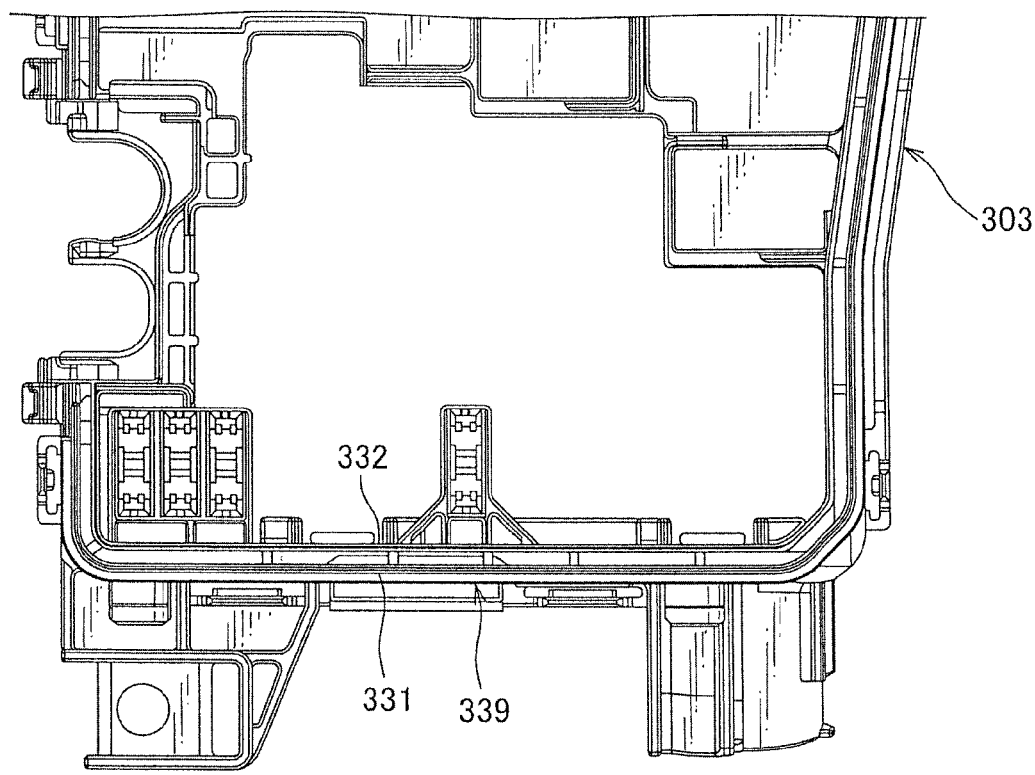
FIG. 8 illustrates a plan view of a body case of a waterproof box used in an electric junction box according to the related art.

Furthermore, water easily splashes on, in particular, a portion located on a front side of the vehicle. Therefore, in the waterproof box 1, the peripheral wall 39 of the body case 3 disposed at a portion on which water easily splashes is configured as follows. That is, as illustrated in FIG. 3, a narrow width portion 7, in which a gap h2 between the outer wall 31 and the inner wall 32 is substantially the same as the other side, and a wide width portion 6, in which a gap h1 between the outer wall 31 and the inner wall 32 is wider than the narrow width portion 7, are formed in one side disposed on the front side of the vehicle in the peripheral wall 39 of the body case 3. Also, the gap h1 of the wide width portion 6 is about two times the gap h2 of the narrow width portion 7. Since the formation of the wide width portion 6 can increase the amount of water discharge from the double wall, it is possible to reliably prevent water from splashing on the electrical components 11, 12, and 13.

Also, the inner wall 32 constituting the wide width portion 6 and the narrow width portion 7 includes connection portions 8 bent from the ends of the wide width portion 6 to the outer side of the case body 3 and from the ends of the narrow width portion 7 to the inner side of the case body 3. Thus, the inner wall 32 has a crank-shaped cross-section, and the rigidity of the body case 3 can be increased as compared with a case where the inner wall 32 has a flat surface. Therefore, it is possible to protect the cassette block 5 inside the body case 3 even when the vehicle collides. Furthermore, in order not to make a gap between the inner wall 32 and the cassette block 5, the inner wall 32 is bent to have a crank-shaped cross-section along the contour of the cassette block 5. In this way, it is possible to absorb rattling of the cassette block 5 due to vibration.

As described above, in the waterproof box 1, since the wide width portion 6 and the narrow width portion 7 are formed at positions intended to increase the amount of water discharge from the double wall and the cross-sectional shape of the inner wall 32 is the crank shape, it is possible to increase the amount of water discharge from the double wall without reducing the rigidity of the body case 3.

Also, the outer wall 31 constituting the wide width portion 6 and the narrow width portion 7 has the flat surface, but, in the present invention, the wide width portion 6 and the narrow width portion 7 may be formed by forming the outer wall 31 in the crank-shaped cross-section, instead of forming the inner wall 32 in the crank-shaped cross-section. Alternatively, the wide width portion 6 and the narrow width portion 7 may be formed by forming both the inner wall 32 and the outer wall 31 in the crank-shaped cross-section. That is, the outer wall 31 may include connection portions bent from the ends of the wide width portion 6 to the inner side of the body case 3 and from the ends of the narrow width portion 7 to the outer side of the body case 3.

The waterproof box 1 according to the present embodiment is configured such that the upper cover 2 is attached straight to the body case 3, but in the present invention, may be configured such that the cover is rotated around one end of the cover in a state in which the end of the cover is engaged with the body case, and the cover is attached to the body case.

Also, in the above-described embodiment, the example in which the waterproof box 1 is used in the electric junction box 10 has been described, but the waterproof box of the present invention can also be used in other electric junction boxes.

Note that the above-described embodiments are merely the representative form of the present invention, and the present invention is not limited to the embodiments. That is, various modifications can be made without departing from the scope of the present invention.

REFERENCE SIGNS LIST 1 waterproof box
2 upper cover (cover)
3 body case
6 wide width portion
7 narrow width portion
8 connection portion
10 electric junction portion
31 outer wall
32 inner wall
39 peripheral wall

The invention claimed is:
1. A waterproof box comprising:
a body case; and
a cover attached to the body case to cover an opening of the body case, wherein
a peripheral wall of the body case has a double-wall structure including an outer wall and an inner wall, such that liquid penetrating from a seam between the cover and the outer wall passes between the outer wall and the inner wall and is discharged to the outside of the body case,
a wide width portion and a narrow width portion which have mutually different gaps between the outer wall and the inner wall are formed in the body case, the gap in the wide width portion being wider than the gap in the narrow width portion, and
connection portions are formed between, and connect, the wide width portion and the narrow width portion.
2. An electric junction box comprising the waterproof box according to claim 1.

* * * * *